HUM REDUCTION IN FEEDBACK AMPLIFIERS

Filed Dec. 30, 1950 2 Sheets-Sheet 1

INVENTOR
Lowell H. Good
BY F. J. Harbaugh
ATTORNEY

May 14, 1957 L. H. GOOD 2,792,458

HUM REDUCTION IN FEEDBACK AMPLIFIERS

Filed Dec. 30, 1950 2 Sheets-Sheet 2

INVENTOR

Lowell H. Good

BY F. J. Harbaugh

ATTORNEY 2,792,458

HUM REDUCTION IN FEEDBACK AMPLIFIERS

Lowell H. Good, Riverton, N. J., assignor to Radio Corporation of America, a corporation of Delaware Application December 30, 1950, Serial No. 203,591

2 Claims. (Cl. 179—171)

My invention relates to hum-reducing feedback amplifiers and more particularly to the reduction of power supply fluctuations or ripple in the output circuit of an audio frequency amplifier using an unbalanced inverse feedback circuit.

The many advantages of degenerative feedback are widely known and used in amplifier circuits. One of the main problems in feedback amplifiers has been to produce circuits which are stable and will not oscillate under any loading condition. To obtain the benefits of degenerative feedback, circuits are often used employing feedback from the secondary, or from a tertiary winding, of the output transformer to some portion of the preceding amplifier stages. Those skilled in the art know that the possible phase shifts within the transformer to be in excess of the allowable phase shifts in circuits which are stable under all loading conditions. Consequently circuits using feedback, including the output transformer, employ transformers having closely controlled amplitude and phase characteristics along with phase correcting networks within the remainder of the circuits. Control of phase and amplitude within transformers and circuits becomes a relatively difficult and expensive procedure. Feedback from the primary circuit of an output transformer is known to be capable of very stable operation with no expensive phase controlling circuits and components.

Heretofore the advantages of primary feedback have not been used in some push-pull circuits because of the requirements of providing balanced feedback loops to realize satisfactory hum and distortion characteristics from the circuit. My invention allows the use of primary feedback which is single-sided and yet provides for hum reduction characteristics which equal the hum reduction obtained with balanced feedback arrangements.

An objects of the invention is to provide hum reduction in an unbalanced inverse feedback amplifier system that is substantially as effective as in a balanced feedback amplifier system.

A further object of the invention is to provide for reducing hum from a power supply to an unbalanced inverse feedback amplifier of the single-sided input single-sided output type as well as the single-sided input push-pull output type.

Figure 1:
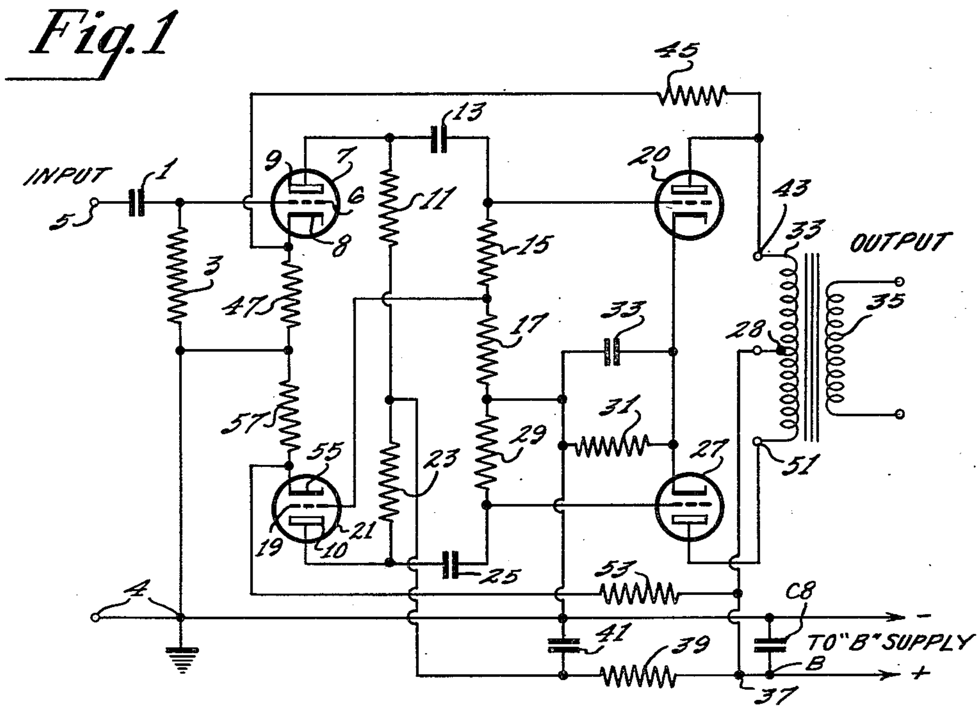
Figure 2:
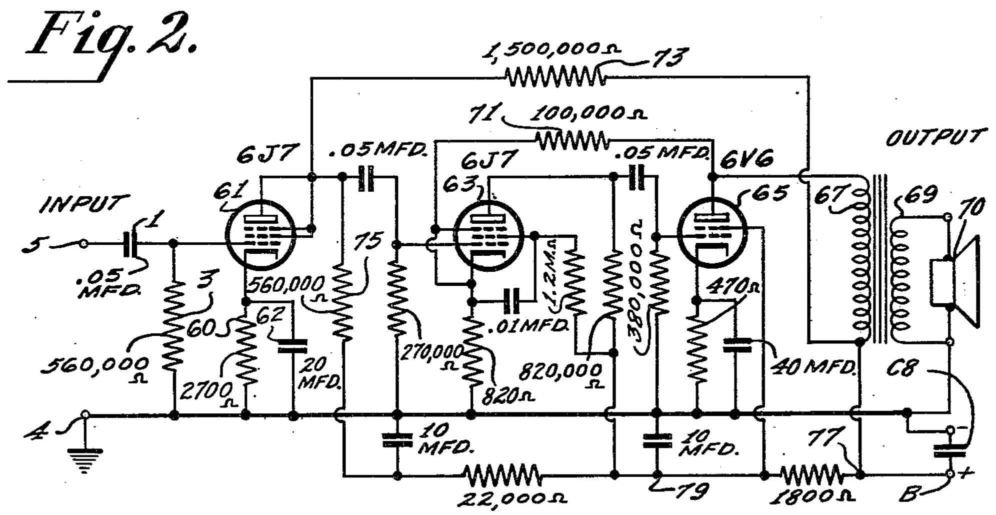
Figure 3:
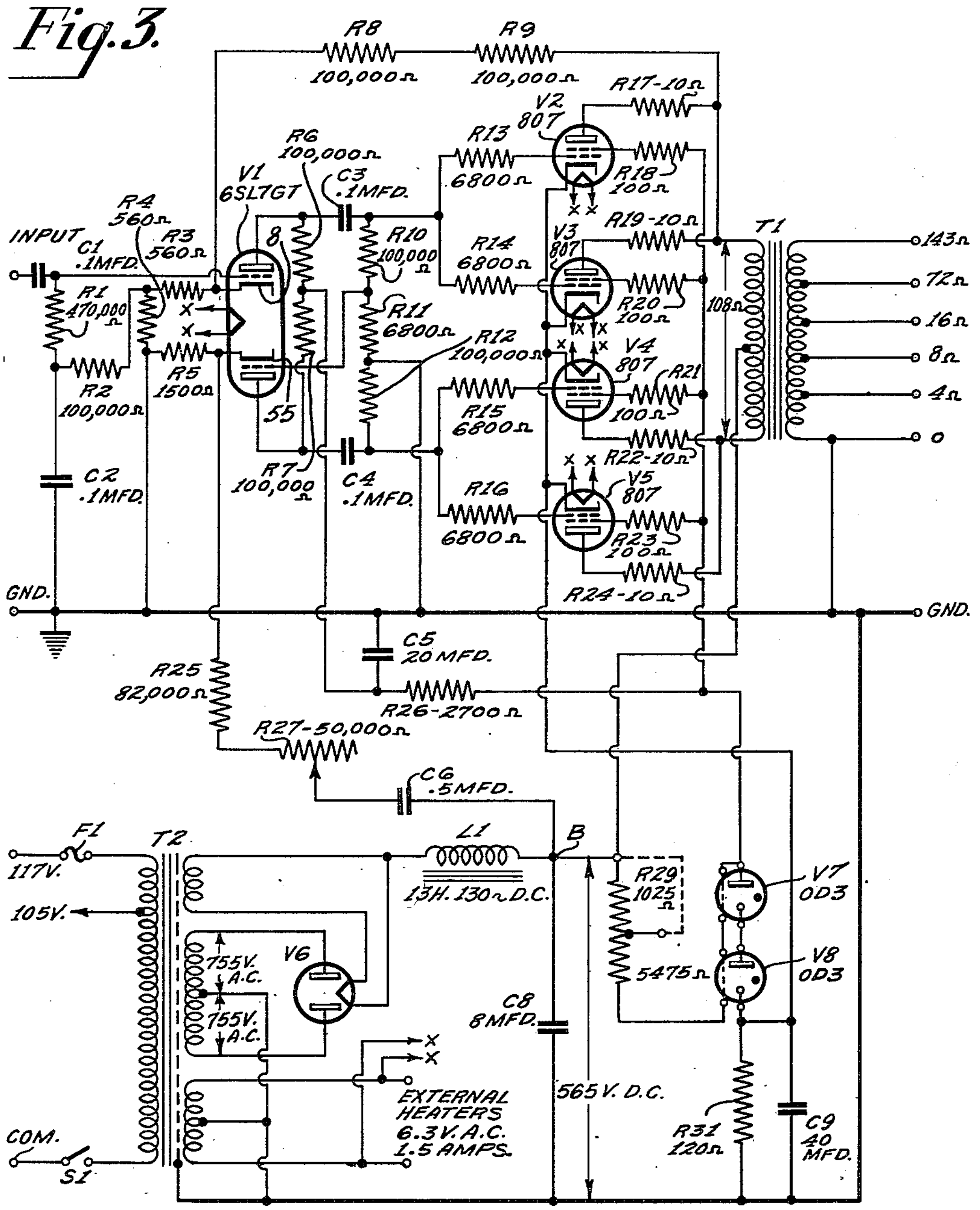

Still further objects of the invention will be apparent as the description of the invention proceeds. Embodiments of the invention are shown in the accompanying drawings, in which:

Fig. 1 is a simplified circuit diagram of an amplifier with single-sided input and push-pull output embodying the invention, Fig. 2 is a circuit diagram of a modified amplifier circuit, with singled-sided input and output circuits, embodying the invention, Fig. 3 is a detailed circuit diagram of a practical production circuit embodying the novel features shown in Fig. 1.

As an example of the steps that have been taken to reduce the troubles arising from phase shift in a coupling transformer included in a feedback loop, reference is made to patents of Oman 2,255,804 and Vance 2,255,805, September 16, 1941. After considerable experience with such transformer circuits Oman eliminated the transformer and used a circuit shown in his Patent 2,313,962, March 16, 1943. In general it can be stated that reduction in phase shift in transformers for stability in inverse feedback loop circuits is not consistent with reduction in distortion at the lower audio frequencies. The design of transformers for low distortion dictates the use of considerable iron and a greater number of windings. This increases the leakage and distributed capacity, and therefore the phase shift and corresponding tendency to instability which can occur out to frequencies of one or two hundred kilocycles.

In accordance with the invention I have avoided such problems by taking the inverse feedback from the primary circuit of the transformer, thereby avoiding instability due to phase and amplitude response of the transformer at the higher frequencies and giving greater freedom of design of the transformer for higher fidelity and/or lower cost. However, in so doing, another problem has been introduced, namely increased hum or unfiltered ripple from the power supply, because of an unbalanced feedback circuit inherent in feedback from a single-sided output, or one half of a push-pull output, to a single-sided input. Heretofore, in such arrangements it has been the practice to substantially improve the filtering to the anode circuit of the output stage, at considerable expense. In some cases it was necessary to add an expensive iron core choke. It is generally thought that a main benefit of feedback is the reduction of hum introduced into the loop circuit, and this is true for balanced feedback, as from push-pull output to push-pull input, as in above first named Oman patent, but unbalanced feedback circuits do not necessarily reduce hum, in the output stage, and in some cases has been known to increase it.

Practical amplifiers designed for commercial use have "B" power supply circuits with a certain amount of ripple or fluctuations in potential, the result of incomplete filtering. It is a simple matter to supply well filtered operating "B" voltage to the first stages of an amplifier, which stages draw only small currents, as by series high resistors and large shunt capacitors, but it is a different matter to supply the anodes of the last stage which draw relatively heavy current. In a push-pull output circuit this ripple potential is of the longitudinal type as contrasted with a transverse signal. Consequently, if the output circuit is balanced, this ripple does not reach the load.

Referring to Fig. 1 for a more complete understanding of the invention there is shown an amplifier system with a single-sided input circuit including coupling capacitor 1, resistor 3 and terminal 5 adapted to be connected to a source of audio frequency signals, such as a preamplifier or a phonograph pickup. The single-sided input circuit is connected to the control electrode 6 of a first thermionic amplifier 7, the anode 9 of which is supplied with filtered rectified current through a coupling resistor 11. The output circuit of amplifier 7 comprises the resistor 11, a coupling capacitor 13 and resistors 15 and 17, for supplying signal energy to one thermionic amplifier 20 of a push-pull output stage and to the input electrode 19 of a phase inverter device 21 like device 7. The phase inverter operates in a manner disclosed by Gorton Patent 1,654,075, December 27, 1927. While the invention has been illustrated with a phase inverter of the Gorton type, it can be used with the split anode-cathode type, shown in Meissner 2,027,054 January 7, 1936. While the inverter is an amplifier it is operated with little or no gain. The output electrode 10 of the phase inverter is supplied with filtered current from the "B" supply through a coupling resistor 23 and its output circuit comprises resistor 23 and coupling capacitor 25 for supplying signal energy of the opposite phase to the other, or fourth, amplifier 27 of the push-pull output stage. The input electrode circuit of amplifier 27 is completed through a resistor 29 and self-bias resistor 31 and by-pass capacitor 33, the last two elements being common to amplifier 27 and 20 for supplying the necessary grid bias.

The output electrodes of amplifiers 20 and 27 are connected to the conventional push-pull transformer comprising a center-tapped primary winding 33 feeding a coupled secondary winding 35 in step-down relation. Push-pull amplifiers 20 and 27 are supplied with anode current by a connection from the center-tap 28 of primary winding 33 to the "B" supply at point 37 of high potential and good regulation but having relatively low filtering, and the anode circuits of amplifiers 7 and 21 are supplied with operating current by a connection between resistor 11 and 23 to the point 37 of the "B" supply through a filter resistor 39 which, with the help of a large filter capacitor 41, provides adequate filtering. This arrangement is known as "proportionate filtering," and is disclosed in Anderson, 2,086,595 July 13, 1937. Practical amplifiers for the most part have "B" supplies which have some ripple potential particularly on the output stage for reasons above given. In a push-pull output circuit this ripple is of the longitudinal type as contrasted with a transverse signal. Consequently if the output circuit is balanced, and not upset by a feedback circuit, this ripple does not reach the load. In the present case, however, inverse feedback is provided, by means of a connection from a point on the transformer primary circuit, preferably the terminal 43 of the primary winding 33, through resistor 45 to cathode electrode 8 of amplifier 7 and through self-bias resistor 47 to the ground return terminal 4. The feedback is preferably to a point ahead of the phase inverter. When single-sided feedback, of this type, is taken from the primary side of the output transformer the ripple voltage from the "B" supply existing at terminal 43, across the upper half of the winding, is fed back to the input circuit and is amplified by amplifier 7, as a signal voltage, and appears eventually across the transformer secondary 35 as a hum or ripple potential.

If the input circuit were a balanced input to a push-pull first stage instead of a single-sided input with a phase inverter, there would be another feedback resistor, similar to 45, connected from the terminal 51 of the transformer primary back to the cathode of the other side of the push-pull input stage. In such case, equal amounts of ripple would be fed to the input circuits and would appear across the primary of the output transformer primary as a longitudinal signal, and would not appear in the secondary of the output transformer.

In order to give the advantage of a balanced feedback of ripple potentials, when using a single-sided feedback as shown, in accordance with the invention a portion of the power supply ripple is introduced in 180 degree phase relation to that fed back over the inverse feedback path. For this purpose a resistor 53 is connected from terminal 37 of the "B" supply back to cathode 55 of phase inverter 21 through self-bias resistor 57 to ground. The actual value of the ripple voltage fed to the cathode circuit is approximately twice that coming through the signal feedback loop to the resistor 47. While resistor 53 has been connected to the cathode circuit of tube 21 as a preferred arrangement it may be connected to the grid circuit of tube 7 provided the input source impedance is constant, for example, if there is no input potentiometer type volume control. In the system shown, where amplifiers 7 and 21 were alike and bias resistors 47 and 57 were of the same value, it seems apparent to those skilled in the art that the ripple voltage introduced by the signal feedback loop, including resistors 45 and 47, is effectively double at the input electrodes of the push-pull output stage by the normal amplifying action of the phase inverter circuit. In order to obtain the above voltage relations, resistor 45 was of the order of twice the value of resistor 53.

One possible objection to the use of a single-sided feedback loop with a balanced output stage is the resultant unbalanced feedback tending to cause unfavorable distortion characteristics. If the coupling between halves of the output transformer primary is maintained substantially at unity for the range of frequencies desired, the single-sided feedback loop can be considered to give results equivalent to a balanced signal feedback arrangement. In the art of transformer design, unity coupling between halves of the primary can be economically realized for all frequencies of interest. In a model of an audio frequency amplifier built in accordance with the invention lower distortion at the higher frequencies (5–15 kc.), was accomplished as compared to the balanced type feedback circuits formerly used and which this model was designed to replace.

Referring to Fig. 2, a practical embodiment of the invention is illustrated in an amplifying system having a single-sided input and single-sided output, with a ripple balancing or bucking circuit as in Fig. 1. A first thermionic amplifying device 61, a 6J7 type pentode connected as a triode, has its input electrode connected to a single-sided input circuit comprising terminals 4 and 5, a coupling capacitor 1 and a resistor 3. A self-bias resistor 60 and a by-pass capacitor 62 is connected in the cathode circuit of the amplifier as shown. The output electrode of amplifier device 61 is coupled to the input electrode or grid of a second amplifier device 63 through the usual resistor capacitor network of appropriate values indicated on the drawing. The output of amplifier 63 is coupled to the input electrode of a third amplifier 65 by means of a similar resistor capacitor network of the appropriate values as shown. Amplifier 65 is a power output tube of the 6V6 type, known as a beam power tube, and has its output anode coupled to the load circuit, which may be a dynamic loud speaker 70, through a step-down transformer having a primary winding 67 and a secondary 69.

Inverse feedback for improving the fidelity of the amplifier system is provided by means of a resistor 71 of the order of 100,000 ohms connected from the anode of the third amplifier 65, or the high potential terminal of primary 67, back to the cathode electrode of the second amplifier 63. The anode circuits of the amplifiers are operated with rectified alternating current from the "B" supply shown, the first and second amplifier supplies being filtered to a much greater extent than is the third amplifier. As in the case of the circuit of Fig. 1, hum, or ripple potential is fed back to the second amplifier through the inverse feedback path, an unbalanced feedback circuit. This hum, as in the other case, is also balanced out by feeding or introducing ripple potential derived from the "B" supply source by means of a compensating or balancing resistor 73 of the order of 1,500,000 ohms connected between the high potential terminal of the "B" supply source and the output circuit of the first amplifier which is also the input circuit of the second amplifier. In Fig. 2 the hum balancing circuit is fed to substantially the same point as is the inverse feedback circuit. The connection is such that there exists a 180 degree phase relation between the effects of the two feed paths for ripple potential so far as the output amplifier 65 is concerned, and the amount of ripple potential introduced through this path 73 is such that the potentials involved in the output circuit are equal as well as opposite in phase. The load circuit is ordinarily single-sided as shown in Fig. 2.

Consideration was given to impressing the correct amount of hum in proper phase directly upon the anode of amplifier 61 by connecting the anode coupling resistor 75, duly increased in value, to the B source without going through some or any of the supply filtering shown, thereby avoiding the use of resistor 73. There was encountered the problem of obtaining the proper proportion and phase relations of the fundamental and all the harmonics of the hum potential, in order to counteract the like disturbances introduced into the last stage. If the resistor 75 were connected directly to the "B" supply source at the same point 77 to which amplifier 65 is connected, the hum fundamental and harmonic content, as well as proper phase relation, would be present but the amount of hum potential might be excessive. Obviously the connection could be made, as by means of a potentiometer, to an intermediate point on the power supply but then the D.-C. potential would not be the right value. The resistor 75 could be connected to point 79 in the supply, eliminating the present second stage of filtering, and by proper design of the remaining filter the hum potential could be made right but there would be phase problems and some of the hum harmonics would be missing.

After considering other possible solutions and ensuing difficulties, the present arrangement of a separate balancing circuit will be more fully appreciated. By means of the two stages of filtering the hum fundamental and harmonics, with their difficulties, have been practically eliminated leaving substantially pure direct current for operating the amplifier 61. Then by means of the separate circuit the hum disturbance with the same harmonic content as that fed to the last amplifier 65, and derived from the same point 77, is fed to amplifier 61 in the proper amount and phase to give correct cancellation in the output amplified. In other words the hum balancing circuit is preferably connected to the same point in the supply circuit to which the last amplifier circuit is connected insuring that the hum or fluctuation characteristic will be the same for both of said circuits.

Fig. 3 shows the latest embodiment of the invention in an actual production amplifier having an extremely high output of the order of 70 watts with low distortion. This amplifier operates in the same general manner as the circuit of Fig. 1 and it will not be necessary to review the theory of operation. The first thermionic device V–1 is a combined voltage amplifier and phase inverter, the voltage amplifier section of the device being connected to the input circuit comprising capacitor C–1 and resistor R–1. The output of the voltage amplifier section of V–1 is coupled through a resistor-capacitor network R–6, R–10, C–3, to the input electrodes of amplifiers V–2, V–3 connected in parallel, with parasitic oscillation suppressors R–13 and R–14 in the grid circuits. The phase inverter section of device V–1 is connected through similar resistor and capacitor elements to the grid electrodes of amplifiers V–4 and V–5 constituting the other half of a push-pull parallel output. The output electrodes of amplifier devices V–2, V–3, V–4 and V–5 are coupled to a load circuit through transformer T–1, having output taps for impedance matching.

An inverse feedback circuit is provided by resistors R–8 and R–9 connected from one terminal of the primary winding of T–1 to the cathode circuit of the amplifier section of V–1. A hum balancing circuit, operating in the same manner as in Fig. 1 is connected between an output terminal B of the power supply circuit, through capacitor C–6 and resistors R–27 and R–25 to the cathode 55 of the phase inverter section. Resistor R–27 is preferably made variable for a factory adjustment and need not be readjusted unless feedback resistors are changed. In general, the resistance of R–25 and R–27 in series will be around one half of R–8 and R–9 in series for minimum hum. The power supply circuit comprises a transformer T–2, rectifier tube V–6, filter choke L–1, capacitor C–8, regulator tubes V–7 and V–8, resistor R–31, capacitor C–9, and resistors R–29 and R–30. The regulator tubes are used to keep constant the voltage to the screen grids. The dotted lines in V–7 and V–8 represent shorting elements built into the bases of the tubes, contacting terminals in the sockets, for opening the screen supply circuit in case of removal or failure of the regulator tubes.

The systems of Figs. 1 and 2 are supplied with rectified A.-C. current, partially filtered as at terminal B in Fig. 3, but no filter choke is used. For sake of completeness, a large filter capacitor C8, like that in the power supply of Fig. 3, is shown in Figs. 1 and 2 with the amplifier because it serves also as a signal by-pass.

It has been shown by tests that the hum neutralizing circuit, in above disclosed amplifier systems, in accordance with the invention, results in a reduction in hum to a low value of the order of ten per cent of that in the same systems without it. The improvement is inexpensive and of extreme simplicity. If in certain cases the hum requirements are not severe it is possible, in accordance with the invention, to keep about the same hum level as before and to make a less expensive power supply filter. Any desired compromise between the two conditions, extreme reduction in hum and less expensive filtering, is possible as a result of the invention.

What I claim as new is:

1. In a feedback amplifying system adapted to be connected to a load circuit, a first amplifying device having a single-sided input circuit, a second amplifying device connected to the output of said first device as a phase inverter, a pair of amplifying devices connected in push-pull with output circuits in balanced relation, circuits coupling the inputs of said pair of devices to the outputs of said first and second devices respectively, a power supply circuit for said system characterized by undesired fluctuations in potential at one terminal supplying current to said pair of devices, an unbalanced inverse feedback circuit connected from one side of said push-pull output circuit to a point in said single-ended input circuit for reducing distortion, but tending to introduce hum potential at said point and a balancing circuit connected from said terminal to a point in said phase inverter circuit for balancing the effect of said fluctuations introduced into said input circuit by said unbalanced feedback circuit.

2. In a feedback signal amplifying system adapted to be connected to a load circuit, a first amplifying device having a single-sided input circuit, a second amplifying device connected to said first device as a phase inverter, a pair of amplifying devices coupled in push-pull relation to the outputs, respectively of said first and second devices, said devices each comprising anode, cathode and control electrodes, a power supply circuit for said electrodes characterized by an undesired hum potential at a terminal supplying current to the anodes of said pair of devices, said terminal being of substantially no signal potential, an unbalanced inverse feedback circuit comprising a high resistance network connected serially from the anode of one of said pair of devices to the cathode of said first device for reducing distortion but having the undesired tendency of introducing some of said hum potential into said first device, and a hum balancing circuit comprising resistance means serially connected between said power supply terminal and the cathode of said second device.

References Cited in the file of this patent

UNITED STATES PATENTS

| | | |
|---|---|---|
| 2,240,286 | Cousins | Apr. 29, 1941 |
| 2,305,893 | Oman | Dec. 22, 1942 |